United States Patent
Lee et al.

(10) Patent No.: US 8,288,842 B2
(45) Date of Patent: Oct. 16, 2012

(54) METHOD FOR DICING SEMICONDUCTOR WAFERS

(75) Inventors: Hsin-Hui Lee, Kaohsiung (TW);
Chien-Chao Huang, Hsin-Chu (TW);
Chao-Hsiung Wang, Hsinchu (TW);
Fu-Liang Yang, Hsin-Chu (TW);
Chenming Hu, Hsinchu (TW)

(73) Assignee: Taiwan Semiconductor Manufacturing Co. Ltd, Hsin-Chu (TW)

( * ) Notice: Subject to any disclaimer, the term of this patent is extended or adjusted under 35 U.S.C. 154(b) by 1231 days.

(21) Appl. No.: 11/655,008

(22) Filed: Jan. 18, 2007

(65) Prior Publication Data

US 2007/0117352 A1     May 24, 2007

Related U.S. Application Data

(62) Division of application No. 10/725,697, filed on Dec. 1, 2003, now Pat. No. 7,183,137.

(51) Int. Cl.
*H01L 23/544*     (2006.01)
*H01L 21/301*     (2006.01)

(52) U.S. Cl. ............... 257/620; 257/622; 257/E23.194; 257/E21.599; 438/114; 438/465

(58) Field of Classification Search .......... 438/113–114, 438/462, 465; 257/E23.179, E23.194, 620, 257/622, 627
See application file for complete search history.

(56) References Cited

U.S. PATENT DOCUMENTS

| 4,073,055 | A | * | 2/1978 | Kimura et al. | 438/462 |
| 6,107,161 | A | * | 8/2000 | Kitaguro et al. | 438/462 |
| 6,821,867 | B2 | * | 11/2004 | Matsuura et al. | 438/462 |
| 7,052,975 | B2 | * | 5/2006 | Koizumi | 438/460 |
| 7,101,735 | B2 | * | 9/2006 | Noma et al. | 438/114 |
| 2003/0190770 | A1 | * | 10/2003 | Yeom et al. | 438/113 |
| 2007/0105345 | A1 | * | 5/2007 | Kurosawa | 438/460 |

FOREIGN PATENT DOCUMENTS

JP     362105446     5/1987
JP     3-218050     * 9/1991

* cited by examiner

*Primary Examiner* — Mary Wilczewski
*Assistant Examiner* — Toniae Thomas
(74) *Attorney, Agent, or Firm* — Duane Morris LLP

(57) ABSTRACT

A method provides for dicing a wafer having a base material with a diamond structure. The wafer first undergoes a polishing process, in which a predetermined portion of the wafer is polished away from its back side. The wafer is then diced through at least one line along a direction at a predetermined offset angle from a natural cleavage direction of the diamond structure. A wafer is produced with one or more dies formed thereon with at least one of its edges at an offset angle from a natural cleavage direction of a diamond structure of a base material forming the wafer. At least one dicing line has one or more protection elements for protecting the dies from undesired cracking while the wafer is being diced along the dicing line.

19 Claims, 3 Drawing Sheets

METHOD FOR DICING SEMICONDUCTOR WAFERS

RELATED APPLICATION

This application is a divisional application of U.S. patent application Ser. No. 10/725,697, filed on Dec. 1, 2003 now U.S. Pat. No. 7,183,137, the contents of which are hereby incorporated by reference as if set forth in their entirety.

BACKGROUND

The present disclosure relates generally to semiconductor device manufacturing, and more particularly to an improved method for dicing a wafer.

Complementary metal oxide semiconductor (CMOS) integrated circuits, including both N-type devices (NMOS) and P-type devices (PMOS), are employed in the large majority of integrated circuits manufactured today. Semiconductor devices in unpackaged form are known as "dies" when certain processing steps are completed on a wafer substrate. The wafer is then diced to have each die detach from the others so that it can be packaged in a desired device unit for further use.

Many wafer materials used for making the dies thereon are of a diamond crystalline structure at a micro level. For example, silicon based wafers are used for manufacturing purposes, as well as other types of wafers such as SiGe or GaAs types. Due to this diamond crystalline structure, the base material of the wafer tends to break easily along a particular natural cleavage direction. As such, the dies processed on a wafer are usually aligned along its natural cleavage direction so that when the wafer is diced the likelihood to crack the wafer in undesired directions is reduced. In other words, as most of the dies are in rectangular shapes, at least one of their four borders are perpendicular to the wafer's natural cleavage direction.

As the technology advances, the semiconductor wafers are getting thinner and thinner, and the likelihood of breaking the wafer while dicing it has been increased. Further, when new technologies allow the dies to be processed on the wafer with its borders at an offset angle from the natural cleavage direction, it is even more likely to crack the wafer when it is undergoing a dicing process.

What is needed is an improved method and system for dicing wafers in a direction that offsets from the natural cleavage direction of the wafer.

SUMMARY

A method is disclosed for dicing a wafer having a base material with a diamond structure. The wafer first undergoes a polishing process, in which a predetermined portion of the wafer is polished away from its back side. The wafer is then diced through at least one dicing line along a direction at a predetermined offset angle from a natural cleavage direction of the diamond structure.

These and other aspects and advantages will become apparent from the following detailed description, taken in conjunction with the accompanying drawings, illustrating by way of example the principles of the disclosure.

DESCRIPTION

A method is disclosed for dicing a wafer. The wafer has a base material with a diamond structure. After a plurality of dies being processed on the wafer, the wafer is diced along one or more dicing lines that offset from the natural cleavage direction of the base material. Since silicon (Si) is presently the most important semiconductor for the electronics industry, the present invention is described below using silicon wafers as an example. It is understood that the wafer can also be made from other types of base materials such as SiGe or GaAs that have a natural cleavage direction.

The silicon material that is used to form silicon wafers is formed from single crystal silicon. In crystalline silicon, the atoms which make up the solid material are arranged in a periodic fashion. The periodic arrangement of atoms in a crystal is called the lattice. Silicon has a diamond cubic lattice structure (or simply "diamond structure"), which can be represented as two interpenetrating face centered cubic lattices.

Figure 1A:
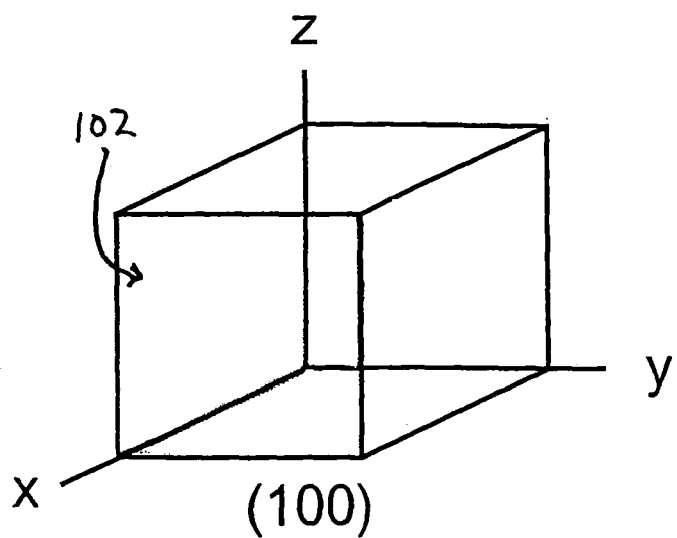
FIGS. 1A-C are illustrations showing three types of crystalline orientation for silicon base material used in a wafer.
Figure 1B:
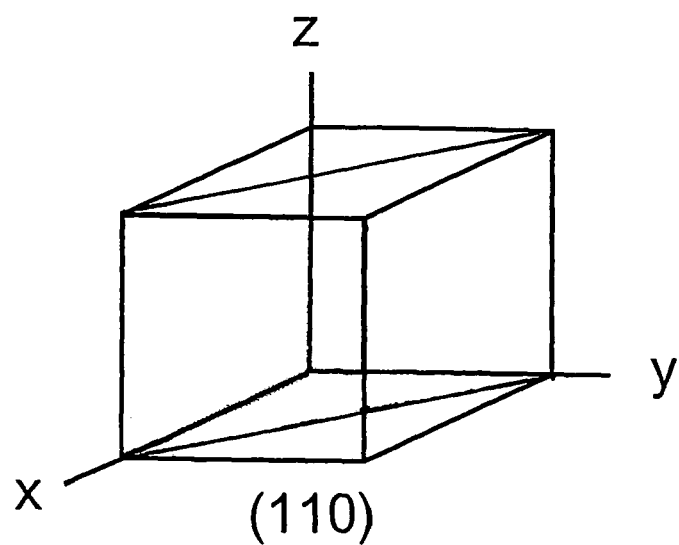
Figure 1C:
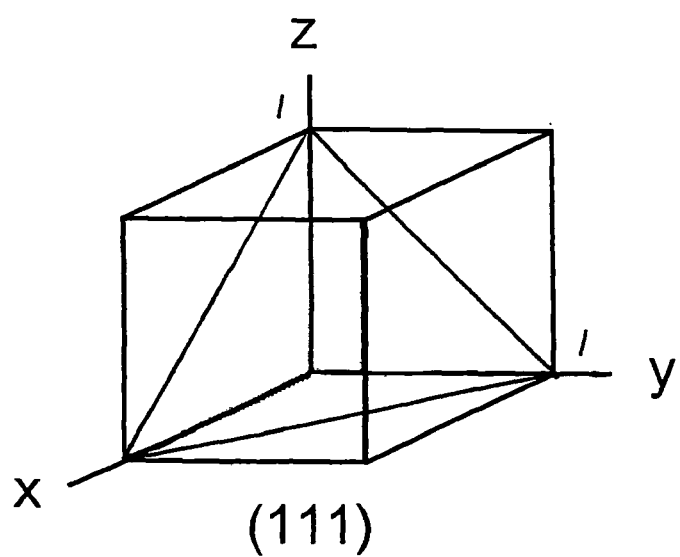

FIGS. 1A-C show three orientations of the crystal plane of silicon. In order to describe the crystal planes, an {xyz} coordinate system is used. The crystal planes describe the orientation of the plane of silicon atoms relative to the principle crystalline axes. In FIG. 1A, a crystal plane 102 of silicon intersects the x-axis at 1 and never intersects the y or z-axis. Therefore, the orientation of this type of crystalline silicon is {100}. Similarly, FIG. 1B shows {110} crystalline silicon and FIG. 1C shows {111} silicon. The {111} and {100} orientations are the two primary wafer orientations in commercial use. In the description herein, references to various planes in silicon crystals will be made, especially to the {100}, {110}, and {111} planes. Note that for any given plane in a cubic crystal there are five other equivalent planes. Thus, the six sides of the cube comprising the basic unit cell of the crystal are all considered {100} planes. As such, the notation {xyz} refers to all six of the equivalent planes. Reference will also be made to crystal directions which are normal to the crystal plane. For example, a crystal direction <100> is in a direction normal to the {100} plane.

Figure 2:
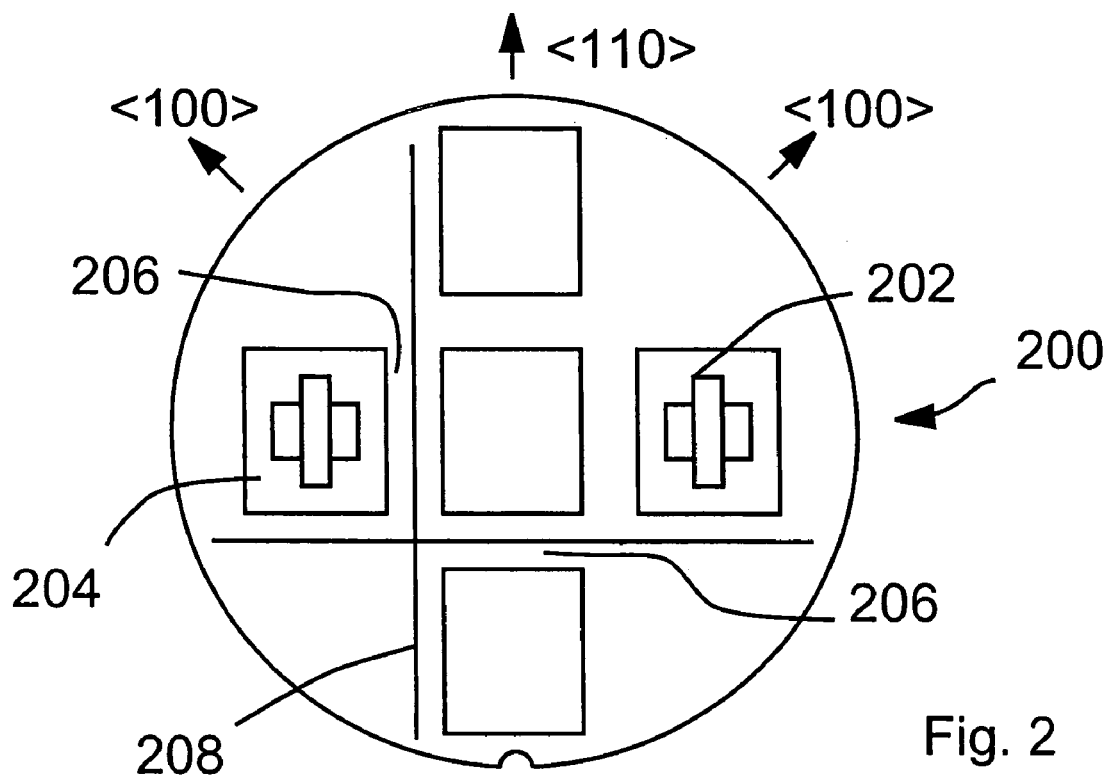
FIG. 2 is a top view of a silicon wafer with its dies aligned with a natural cleavage direction thereof.

FIG. 2 shows a top view of a semiconductor wafer 200, which is commonly referred to as "{100} silicon," which is the predominant type of semiconductor wafer being used today. Most MOS transistors 202 are fabricated on {100} silicon with the gates oriented such that current flows parallel (or perpendicular) to the <110> directions. In addition, since the mass production of electronic devices (or known as dies) uses a wafer as a carrier unit, there are multiple dies 204 produced on each wafer. As shown in FIG. 2, all the dies 204 on the wafer are traditionally arranged in rows and columns with space gaps 206 arranged between the rows and columns. In order to separate each die from the other, the wafer 200 is diced along one or more dicing lines 208 located in the space gaps between the rows or between the columns. As such, when multiple dicing processes have been performed, the dies are eventually separated and ready to be packaged.

On a wafer, due to the diamond structure of the base material, there is a natural cleavage direction. The cleavage direction is the direction along which the wafer is likely to crack or break when under stress. For instance, when a wafer is punched at a point, or when a small cutting force is imposed at a particular point, the wafer may start to crack along a particular direction. This particular direction is referred to as the natural cleavage direction. For example, for the {100} wafer, the natural cleavage direction is the <110> direction. Due to this nature of the wafer, the dies are arranged in rows and columns so that the dicing lines coincide with the natural cleavage direction of the base material. It is noted that the cleavage direction, like the crystal directions described above, is not limited to only one direction on a plane although it may be referred in its singular form. In short, when dicing the wafer between its rows or between its columns, the dicing lines are all preferred to be aligned with the natural cleavage direction. It is noted that the dicing line may be a virtual line without any physical marking on the wafer. The dicing line is where the cutting is performed, and as long as the cutting tools can be informed about the line along which the dicing is performed, physical marking is not necessary.

The wafer dicing process usually induces wafer front side and back side chipping or unintended cracks, which cause wafer yield loss during the wafer dicing process. A thick wafer needs a longer dicing time and thus induces cracks to grow, thereby causing more damage to the wafer. This undesired effect needs to be curtailed so that minimum product loss is assured during the wafer dicing. As the devices are made smaller and smaller, and especially when there is a need to arrange the devices on the wafer without aligning the current flow direction with the silicon orientation, the wafer dicing becomes very difficult because the borders of the dies are no longer aligned with the natural cleavage direction of the wafer base material, and therefore easily causes undesired cracks.

Figure 3:
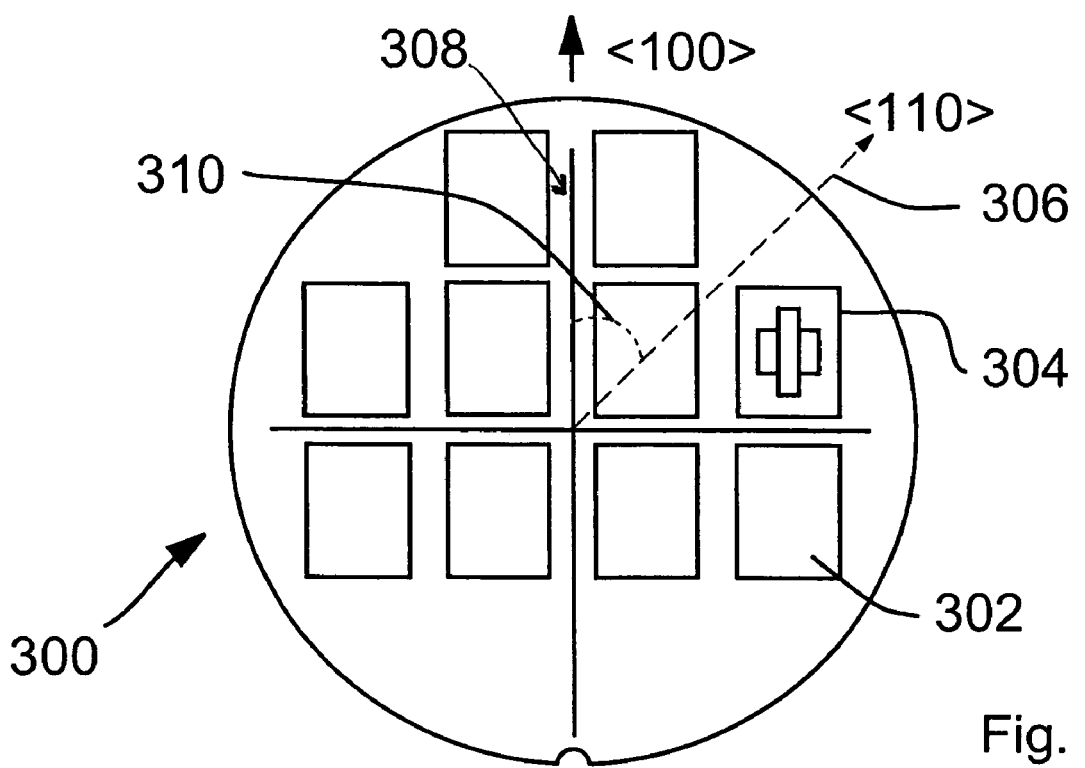
FIG. 3 is a top view of a silicon wafer with its dies made thereon with at least one border line thereof offset from the natural cleavage direction of the silicon base material.

FIG. 3 illustrates a {100} wafer 300 on which dies 302 are processed with their border lines or edges 304 not in line with the natural cleavage direction 306, which is the <110> direction. A dicing line 308 actually offsets from the natural cleavage direction 306 by an offset angle 310. The offset angle 310 can be an angle between 30 and 60 degree. In this example, the angle between <100> and <110> is 45 degree. When there is an offset angle, dicing the wafer becomes difficult as discussed above, and the undesired cracking is hard to control.

According to one example of the present disclosure, the offset angle 310 is first determined based on the natural cleavage direction of the base material for the wafer. This can be done based on what type of base material is used and in what orientation the devices are processed on the wafer. Assuming {100} Si wafers are used, a wafer backside polish process is performed after the formation of the dies. The thinner the wafer, the lower the probability of crack formation, growth and propagation during the wafer dicing process. During the backside polish, a mechanic force may be used such as using a tool to polish or grind away a predetermined portion of the wafer so that the wafer is reduced to a desired thickness. In one example, when the polished {100} Si wafer is thinner than 35 mil, the {100} Si wafer's backside and front side chipping effect is improved during wafer dicing process. In another example, when the thickness is reduced to be lower than 25 mil, the reduced chipping effect is even more visible.

After the wafer thickness is reduced, a single- or dual-blade dicing process can be applied on the wafer along the dicing lines. In order to further reduce the possibility of cracking, the cut width of a single-blade dicing process could be controlled within 10-160 um. When a dual-blade dicing process is used, the first cut width is controlled within 10-160 um to make a relatively wide recess, which does not cut all the way through the wafer. When a second blade is used to cut deeper into the wafer, the second cut width is controlled to be smaller than the first cut width. For example, it can be half of the first cut width, such as within 5-80 um. The second cut can still be such that the blade does not cut through the wafer. With the formation of the dicing lines, when a predetermined stress is imposed, the wafer is diced along the dicing lines. In addition, the angle for inserting the blade to contact the wafer surface is also needed to be considered. For example, for the {100} Si wafer, instead of imposing the blade perpendicular to the surface of the wafer, a better cut angle may be 45 degree. The cut angle can be mathematically determined by formula below:

$$\text{ArcCos}\,[(n^2)/\text{sqrt}(n^2+k^2+l^2)], \text{ or}$$

$$\text{ArcCos}\,[(k^2)/\text{sqrt}(n^2+k^2+l^2)], \text{ or}$$

$$\text{ArcCos}\,[(l^2)/\text{sqrt}(n^2+k^2+l^2)]$$

where n, k and l are integers and all in the range of 0<=(n, k, l)<=4. Based on this calculation method, several sample cut angle choices can be about or less than 77, 56, 48, or 37 degree. It is further noted that different cut angles can be used at different dicing directions. For example, a cut angle less than 48 degree can be used in the X direction and another cut angle less than 37 degree can be used in the Y direction.

Further, when dicing the wafer, it is not always necessary that the blade cuts a continuous cut line. For example, a plurality of recesses can be formed and spaced out along the dicing line. The number of these recesses needed is determined based on the dicing result. Alternatively, a long recess line may first be formed before or after the back side grinding, but before the dicing process is carried out.

Other than mechanically dicing the wafer, a fluid beam, instead of a blade or diamond cutting blade, can be used. For example, a water jet can be used to dice the wafer along the dicing lines. The fluid beam used must have sufficient surface energy for maintaining the beam in order to impose a stress on the wafer. Non-mechanical force such as laser beams with sufficient energy can also be used for dicing the wafer. When using the non-mechanical force, a continuous cut line may not be necessary. For instance, the laser beam can burn a series of "holes" along the dicing lines, and then the wafer can be cracked along those lines by imposing predetermined stresses. While dicing the wafer, the back side of the wafer is glued to a particular tape known as the "blue tape," but the {100} wafer can use a UV tape to achieve a better dicing result.

Other dicing parameters are also factors to be considered in order to control wafer chipping. These parameters may include cut speed, fitting speed and fluid flow rate. For example, a fast cut speed could reduce the crack formation during {100} wafer dicing because faster wafer cut speed could reduce the likelihood of having crack nucleation, growth, or propagation. Cut speed higher than 20000 RPM may be suitable for {100} wafers. Secondly, {100} wafer substrate dicing process usually causes wafer vibration and rotation no matter whether the UV tape or blue tape is used. A slow fitting speed could reduce the process induced effect such as wafer vibration or rotation. Feeding speed slower than about 200 mm/sec is preferred to be applied on {100} wafer according to one example. Furthermore, the fluid flow rate could also control the quantity of cutting particles generated by the wafer dicing process. In general, this fluid or liquid material is usually water, DI water, etc. The cutting particles are a source of crack nucleation or growth during the wafer dicing process, especially on {100} wafer substrate, a higher fluid flow rate could remove particles more effectively than a slower liquid flow. If the fluid flow rate could be controlled to be higher than 0.1 liter/min, for example, it would also contribute to minimizing the wafer yield loss.

Figure 4:
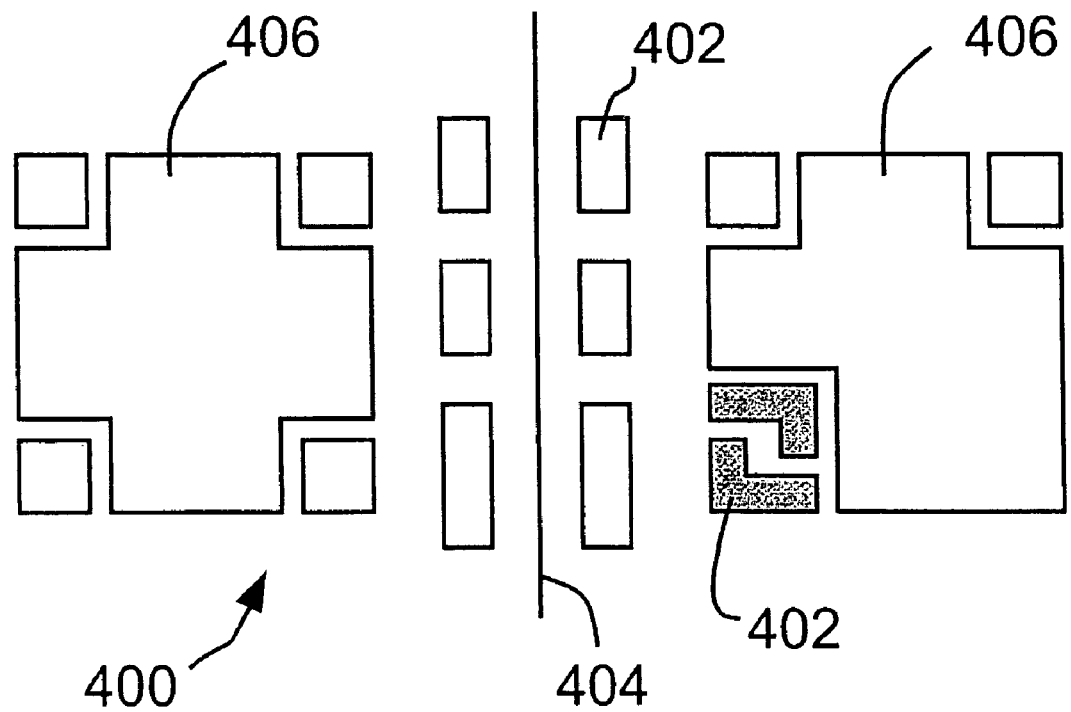
FIG. 4 is a top view of a wafer with protection elements built thereon according to one example of the present disclosure.

In order to further reduce cracking, protection elements are added on the wafer. FIG. 4 is a top view of a portion of the wafer 400 with a plurality of protection elements 402 positioned along a dicing line 404. The protection elements 402 are arranged to protect the die from being cracked unintentionally. These may be metal elements, dielectric elements, or recesses. Other than short-length recesses, relatively long continuous grooves can also be formed. Further, the protection elements 402 may also be arranged at one or more locations around the periphery of the dies. In one example, the protection elements 402 on the periphery of the die are unconnected from a core circuitry 406 of the die. In some example, the protection elements may be of a particular shape that will provide the best protection effect during the dicing process. Some protection elements may enhance the local material strength so that the unintended cracks will not propagate toward the dies. Some protection elements such as the recesses may help to absorb stresses imposed.

Figure 5:
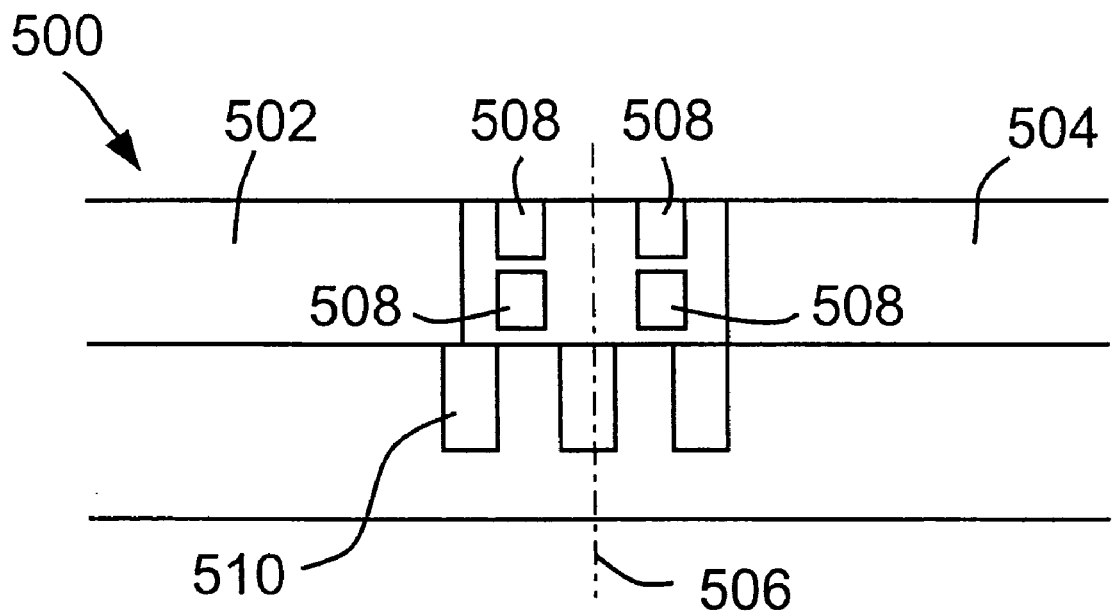
FIG. 5 is a cross-sectional view of a wafer with protection elements according to one example of the present disclosure.

FIG. 5 is a cross-sectional view showing a portion of the wafer 500 along the dicing line. Two dies 502 and 504 are shown, and the wafer is to be diced between these two dies along a virtual dicing line 506. Several protection elements 508 can be placed at different vertical heights. For example, as the dies have a plurality of layers, the protection elements 508 can be formed on different layers. These can be pure metal such as silver, but they can also be compounds for enhancing the material strength of the area around them. Moreover, they can be stacked on top of each other, but they can also be offset from each other as long as the protection elements are positioned to prevent undesired cracking. Further, other forms of protection elements such as protection recesses 510 formed into the wafer substrate can also help improve the dicing process. It is understood that the protection elements 508 and protection recesses 510 can be used in combination or can be used separately. As shown, these recesses can be formed below the die level and close to the edge of the dies. Alternatively, they can be substantially leveled with the dies (not shown). They can be filled with organic materials for absorbing the stress caused by the dicing process to protect the dies from unintended cracking.

The above disclosure provides many different embodiments, or examples, for implementing different features of the invention. Specific examples of components, and processes are described to help clarify the invention. These are, of course, merely examples and are not intended to limit the invention from that described in the claims.

While the invention has been particularly shown and described with reference to the preferred embodiment thereof, it will be understood by those skilled in the art that various changes in form and detail may be made therein without departing from the spirit and scope of the invention, as set forth in the following claims.

What is claimed is:

1. A method for dicing a wafer having a base material with a diamond structure comprising:
   polishing a predetermined portion of the wafer from its back side; and
   dicing the wafer through at least one line along a direction at a predetermined offset angle from a natural cleavage direction of the diamond structure including conducting a first dicing to form a first dicing recess on the wafer and conducting a second dicing within the first dicing recess to form a second dicing recess at a width narrower than that of the first dicing recess.

2. The method of claim 1 wherein a thickness of the wafer after polishing is smaller than 25 mil.

3. The method of claim 1 wherein the offset angle is an angle, between 30 and 60 degree.

4. The method of claim 1 wherein the base material is one of GaAs and SiGe.

5. The method of claim 1 wherein the dicing further includes inserting a dicing tool onto the wafer at a predetermined angle with reference to a surface of the wafer.

6. The method of claim 5 wherein the predetermined angle is less than 56 degree.

7. The method of claim 5 wherein the predetermined angle is mathematically determined by one of:
   $ArcCos [(n^2)/sqrt(n^2+k^2+l^2)]$, where n, k and l are integers and in the range of $0<=(n, k, l)<=4$;
   $ArcCos [(k^2)/sqrt(n^2+k^2+l^2)]$, where n, k and l are integers and in the range of $0<=(n, k, l)<=4$; and
   $ArcCos [(l^2)/sqrt(n^2+k^2+l^2)]$, where n, k and l are integers and in the range of $0<=(n, k, l)<=4$.

8. The method as in claim 1 wherein the dicing further includes using a fluid beam for dicing the wafer.

9. The method of claim 1 wherein the dicing further includes using a laser beam for dicing the wafer.

10. The method of claim 1 wherein the first and second dicing recesses are at a level below a die formed on the wafer.

11. The method of claim 1 wherein the first and second dicing recesses are filled with one or more organic materials for absorbing stress caused during the dicing.

12. A wafer comprising:
    one or more dies formed thereon with at least one of its edges at an offset angle from a natural cleavage direction of a diamond structure of a base material forming the wafer; and
    at least one dicing line having one or more protection elements for protecting the dies from undesired cracking while the wafer is being diced along the dicing line, wherein the die further includes one or more protection elements at one or more predetermined locations on its periphery, the protection elements not connected to core circuitry of the die.

13. A wafer comprising:
    one or more dies formed thereon with at least one of its edges at an offset angle from a natural cleavage direction of a diamond structure of a base material forming the wafer; and
    at least one dicing line having one or more protection elements for protecting the dies from undesired cracking while the wafer is being diced along the dicing line, wherein the protection elements are metal elements formed on the wafer.

14. A wafer comprising:
    one or more dies formed thereon with at least one of its edges at an offset angle from a natural cleavage direction of a diamond structure of a base material forming the wafer; and
    at least one dicing line having one or more protection elements for protecting the dies from undesired cracking while the wafer is being diced along the dicing line, wherein the protection elements are dielectric elements formed on the wafer.

15. The wafer of claim 12 wherein the protection elements are one or more recesses formed into the wafer.

16. The wafer of claim 15 wherein the recesses are at a level below a die formed on the wafer.

17. The wafer of claim 15 wherein the recesses are substantially leveled with a top surface of a die formed on the wafer.

18. The wafer of claim 15 wherein the recesses are filled with one or more organic materials for stress caused during the dicing.

19. A wafer comprising:
- one or more dies formed thereon with at least one of its edges at an offset angle from a natural cleavage direction of a diamond structure of a base material forming the wafer; and
- at least one dicing line having one or more protection elements for protecting the dies from undesired cracking while the wafer is being diced along the dicing line, wherein the die further includes one or more protection elements at one or more predetermined locations on its periphery, the protection elements not connected to core circuitry of the die,
- wherein the protection elements are one or more recesses formed into the wafer and substantially leveled with a top surface of a die formed oh the wafer.

* * * * *

UNITED STATES PATENT AND TRADEMARK OFFICE
CERTIFICATE OF CORRECTION

PATENT NO.        : 8,288,842 B2            Page 1 of 1
APPLICATION NO.   : 11/655008
DATED             : October 16, 2012
INVENTOR(S)       : Hsin-Hui Lee et al.

It is certified that error appears in the above-identified patent and that said Letters Patent is hereby corrected as shown below:

In the Claims:

Column 8, Line 8, delete "oh" and insert -- on --.

Signed and Sealed this
Ninth Day of April, 2013

Teresa Stanek Rea
*Acting Director of the United States Patent and Trademark Office*